US005578945A

United States Patent [19]
Flora

[11] Patent Number: 5,578,945
[45] Date of Patent: Nov. 26, 1996

[54] METHODS AND APPARATUS FOR PROVIDING A NEGATIVE DELAY ON AN IC CHIP

[75] Inventor: Laurence P. Flora, Valley Center, Calif.

[73] Assignee: Unisys Corporation, Blue Bell, Pa.

[21] Appl. No.: 348,277

[22] Filed: Nov. 30, 1994

[51] Int. Cl.$^6$ .................................................. H03K 19/096
[52] U.S. Cl. ............................ 326/93; 326/101; 327/156
[58] Field of Search .............................. 326/93, 101, 21; 327/155–156, 159, 233, 236, 258

[56] References Cited

U.S. PATENT DOCUMENTS

| | | | |
|---|---|---|---|
| 5,072,195 | 12/1991 | Graham et al. | 327/156 |
| 5,073,730 | 12/1991 | Hoffman | 326/93 |
| 5,295,164 | 3/1994 | Yamamura | 327/159 |
| 5,307,381 | 4/1994 | Ahuja | 327/156 |
| 5,420,544 | 5/1995 | Ishibashi | 326/93 |

Primary Examiner—Edward P. Westin
Assistant Examiner—Jon Santamauro
Attorney, Agent, or Firm—Nathan Cass; Mark T. Starr

[57] ABSTRACT

An integrated circuit chip on which a relatively large on-chip delay is provided using a relatively small delay in conjunction with a phase-locked-loop, whereby the relatively large variations typical of large on-chip delays are avoided.

10 Claims, 3 Drawing Sheets

METHODS AND APPARATUS FOR PROVIDING A NEGATIVE DELAY ON AN IC CHIP

BACKGROUND OF THE INVENTION

The present invention is generally directed to improved methods and apparatus for controlling the timing of signals provided on an integrated circuit (IC) chip.

As is well known, in designing digital logic circuitry for use on an IC chip, there often arises a need for additional timing edges besides those provided by a standard system clock. This is particularly true for IC chip designs which utilize memory structures (RAM, ROM, etc.). These additional timing edges may typically take the form of clocks which are required to switch at times other than the standard system clock.

The need to provide these additional timing edges creates a problem with respect to IC chips, particularly VLSI (very large scale integrated) circuit chips where it is desirable to compact as much as possible onto the chip. This problem arises because of the difficulties involved in accurately providing such additional timing edges on a VLSI chip.

Typically, additional timing edges are provided on an IC chip by delaying the standard system clock by a prescribed amount using serially-connected inverters or other active delay elements formed on the chip. These active on-chip delays are severely affected by unpredictable processing variations as well as by voltage and temperature, which can cause the resulting delay to vary by as much as ±60%. Thus, when a large delay is required to be provided on an integrated circuit chip, this ±60% variation may not be tolerable. A typical known solution is to provide this required long delay circuitry off-chip where accuracy can be more precisely controlled. However, this has the severe disadvantage of requiring more parts, more board space, and more expense.

An example of the problem associated with providing a relatively long on-chip delay on an IC chip is illustrated by the graphs in FIG. 1.

Graph A in FIG. 1 illustrates a typical standard system clock C having a clock cycle time T with rising clock edges occurring at times T1 and T3, and falling clock edges occurring at times T2 and T4.

Graph B in FIG. 1 illustrates a FIRST DELAYED CLOCK C1 produced by an on-chip delay d1 providing a relatively small delay (e.g., d1=0.10 T). It is assumed in Graph B that d1 varies by about ±40% of d1, as indicated by $\Delta d1$.

Graph C in FIG. 1 illustrates a SECOND DELAYED CLOCK C1 produced by an on-chip delay d2 providing a relatively large delay (e.g., d2=0.90 T). Similar to d1 in Graph B, it is assumed in Graph C that d2 varies by about ±40% of d2, as indicated by $\Delta d2$.

As shown by Graph B in FIG. 1, the effect of $\Delta d1$ on the timing edges provided by C1 is relatively small and can easily be tolerated. This will be evident by noting that, for d1=0.10 T, $\Delta d1$ will only amount to about 0.08 T.

However, as shown by Graph C in FIG. 1, the effect of $\Delta d2$ on the timing edges of C2 is intolerable, since it can cause the rising edge of C2 to occur in the next clock cycle (after T3). This will be evident by noting that, for d2=0.90 T, $\Delta d2$ will amount to about 0.72 T. This will cause the rising clock edge of C2 to occur at about 1.26 T (0.90 T+0.36 T), which is greater than the clock cycle time T, as illustrated in Graph C. Note that this occurred assuming that $\Delta d2$ varies by ±40% Since this variation may typically be ±60% in the worst case, the provision of other than relatively small delays on a chip can present a serious problem. This is a primary reason why the prior art normally provides relatively long delays (such as those greater than T/2) off-chip where delay variations can be better controlled.

SUMMARY OF INVENTION

A broad object of the present invention is to provide improved methods and apparatus for creating chip delays on an IC chip.

A more specific object of the present invention is to provide improved methods and apparatus for creating a relatively large on-chip delay on a IC chip having significantly less variability than heretofore possible.

Another object of the present invention is to provide improved methods and apparatus for creating clock signals on an IC chip having edges which occur at different times from normally available clock edges.

A further object of the present invention in accordance with one or more of the foregoing objects is to provide the aforementioned methods and apparatus in an efficient and economical manner.

In a preferred embodiment of the present invention directed to accomplishing the above objects, a significant technical advance is obtained by advantageously creating a "negative" on-chip delay which can be used as a substitute when a large delay (such as greater than T/2) is required, whereby delay variations are maintained within tolerable limits, even for relatively large delays.

The specific nature of the invention as well as other objects, advantages and uses thereof will become evident from the following description of a preferred embodiment of the invention in conjunction with the accompanying drawings.

DESCRIPTION OF PREFERRED EMBODIMENTS

Like numerals and characters represent like elements throughout the figures of the drawings.

Figure 2:
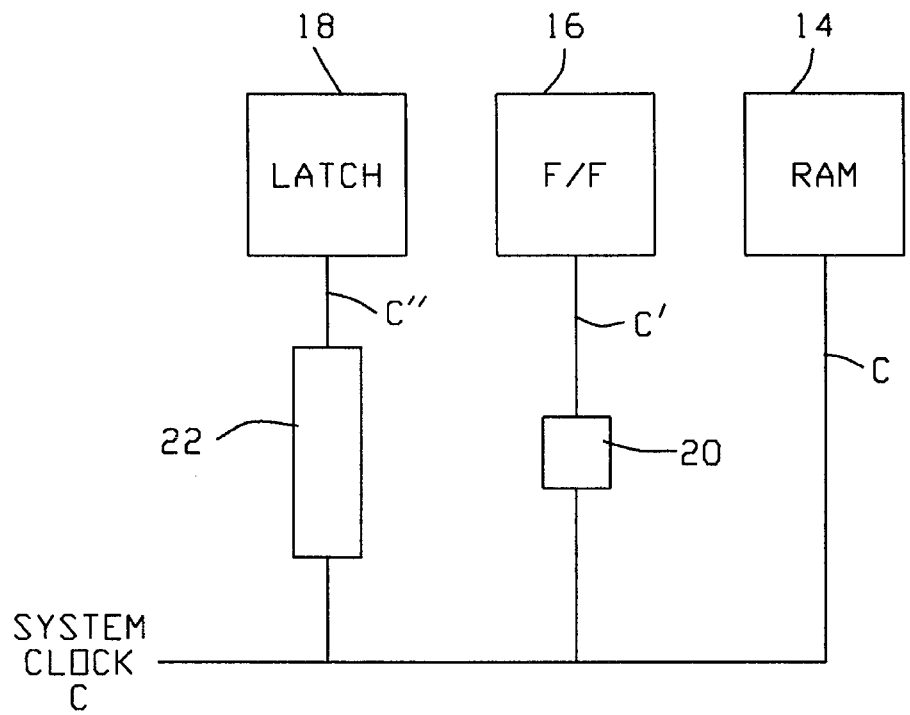
FIG. 2 is a block diagram illustrating how delays are conventionally provided on an IC chip.

Referring to FIG. 2, shown therein is a block diagram illustrating how delays are typically provided on an IC chip, such as a VLSI chip. As indicated in FIG. 2, the chip includes a RAM (random access memory) 14, a flip-flop 16 and a latch 18. Of course, other circuitry is also provided on the chip, but is not shown since it is not pertinent to the present invention.

It will be assumed that RAM 14 in FIG. 2 requires the normal system clock C, that flip-flop 16 requires a clock C' having a rising edge which occurs a relatively short time d' after the rising edge of system clock C, and that latch 18 requires a clock C" having a rising edge which occurs a relatively long time d" after the rising edge of system clock C. The delay d' required for clock C' may typically be provided by an on-chip delay 20, and the delay d" required for clock C" may typically be provided by an on-chip delay 22. Graphs A, B and C in FIG. 3 respectively illustrate system clock C, flip-flop clock C' and latch clock C" provided by FIG. 2, and the delays d' and d" provided for C' and C", respectively.

Figure 1:
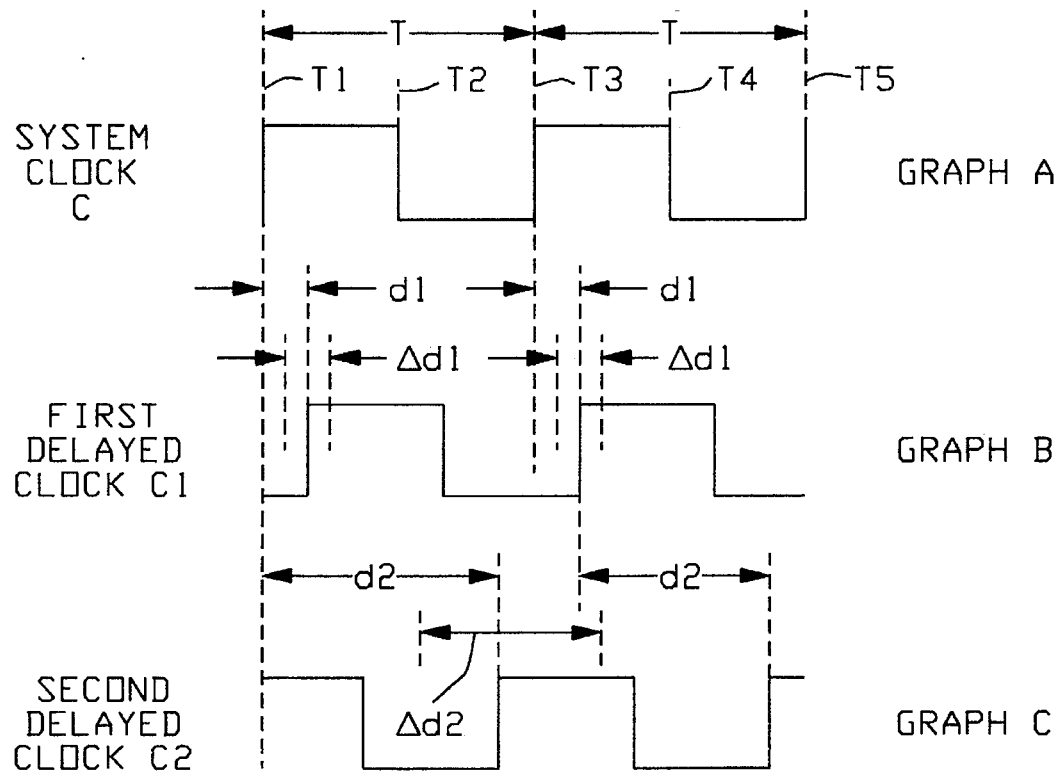
FIG. 1 is a series of graphs illustrating problems that can occur using known on-chip delays for creating timing signals.

Since the delay d' of delay 20 in FIG. 2 is relatively short, its worst case variations can be tolerated, as previously explained with respect to the first delayed clock C1 in FIG. 1. However, since delay d" of delay 22 is relatively long, its worst case variations could create the problem illustrated for the SECOND DELAYED CLOCK C2 in Graph C of FIG. 1, which illustrates how this worst case delay can cause the rising edge of the delayed clock to occur in the wrong clock cycle. One way of preventing this problem from occurring is to test delay 22 on each chip to make sure that its actual worst-case delay variation is within acceptable limits. This added testing is undesirable since it can significantly increase the manufacturing cost. Another way of solving this problem is to provide this relatively long delay 22 off-chip, which is also undesirable, as pointed out previously.

Figure 4:
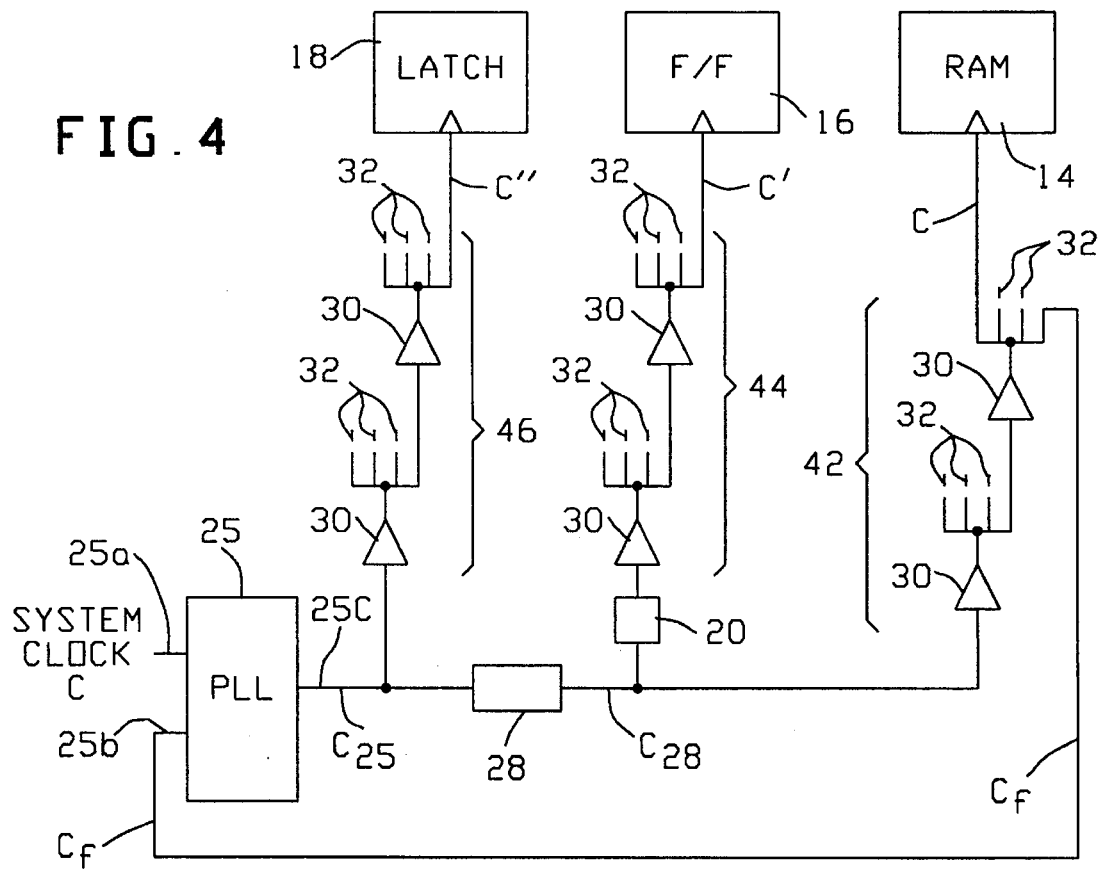
FIG. 4 is a block diagram illustrating a preferred embodiment of the present invention for creating a relatively long delay on an IC chip.

FIG. 4 illustrates a preferred embodiment of the invention which provides a unique solution to the above described problem of providing an on-chip long delay by creating an on-chip "negative" delay on the chip which can be used instead of a required long delay when its worst case variations could cause a problem.

Figure 3:
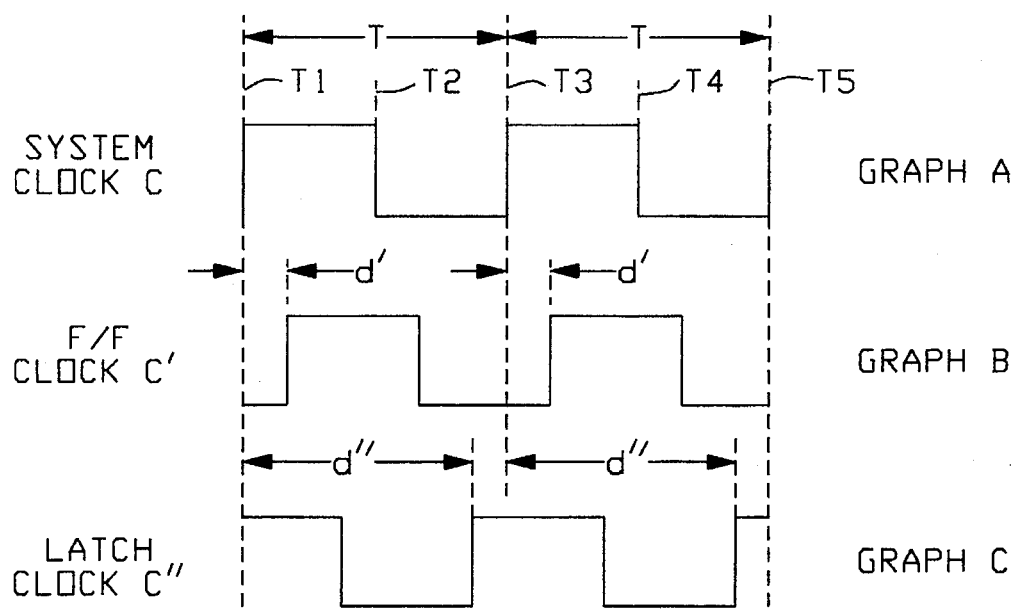
FIG. 3 is a series of graphs illustrating the delays produced by FIG. 2.

With reference to FIG. 4, illustrated therein is the same RAM 14, flip-flop 16 and latch 18 shown in FIG. 2. However, an important difference is the manner in which the long delay d" illustrated in Graph C of FIG. 3 is provided for latch 18.

As shown in FIG. 4, the system clock C is applied to a phase-locked-loop (PLL) 25, which may be of conventional form. PLL has inputs 25a and 25b and an output 25c. The system clock C is applied to input 25a and a feedback clock signal $C_f$ is applied to input 25b. As is well known, a PLL exhibits the characteristic of automatically adjusting its phase so that signals applied to its inputs 25a and 25b are synchronized. Accordingly, PLL 25 will operate to synchronize the feedback clock signal $C_f$ with the system clock C. This feedback clock signal $C_f$ as well as system clock C may thus be used where a normal system clock C is required, such as for application to RAM 14.

Still with reference to FIG. 4, output 25c of PLL 25 is applied to a delay 28 whose output passes through clock buffer path 42 to become the clock $C_f$ applied to RAM 14. As is conventional, this clock buffer path 42 includes inverters 30 which are used to permit the signal applied thereto to drive a plurality of other lines, such as generally indicated by lines 32. For simplicity of illustration, those lines 32 which are directed to other chip circuitry not pertinent to the present invention are shown terminated with dashes. As explained previously, PLL 25 causes $C_f$ to be synchronized with the system clock C, thereby meeting the requirement that RAM 14 receive the system clock C.

So far, it has been described how a clock $C_f$ synchronized with the system clock C is provided for RAM 14 by the synchronizing operation provided by PLL 25. It will next be described how clocks C' and C" are provided by FIG. 4 for flip flop 16 and latch 18, respectively.

As shown in FIG. 4, clock C' is provided for flip flop 16 by passing the output of delay 28 to flip flop 16 via delay 20 and a clock buffer path 44 including inverters 30. Clock buffer path 44 is chosen to provide the same delay as path 42. As a result, clock C' will be delayed from clock $C_f$ (system clock C) by the delay provided by delay 20, since other delays (paths 42 and 44) are the same. The relatively small delay d' required by flip flop 16 is thus provided by choosing delay 20 equal to d'. Since d' is relatively small, it can be provided on-chip since its worst case variations will be tolerable, as explained previously.

Next to be described is the manner in which the preferred embodiment of FIG. 4 provides for on-chip implementation of the relatively long delay d" required between clock C" applied to latch 16 and clock $C_f$ (system clock C) applied to RAM 14, despite worst case delay variations which would ordinarily make such an on-chip implementation intolerable.

As shown in FIG. 4, clock C" applied to latch 18 is obtained from PLL output 25c via clock buffer path 46. This clock buffer path 46, like path 44, is chosen to be equal to clock buffer path 42 located between the output of delay 28 and RAM 14. Clock $C_f$ (the system clock C) will thus be delayed from C" by the amount of delay 28, since other delays (path 42 and 46) are the same. This permits the required relatively long delay d" for clock C" to be provided by choosing delay 28 equal to $d_n=T-d"$, where T equals the clock period. For example, for a required relatively long delay d"=0.90 T, delay 28 need merely provide the relatively small on-chip delay $d_n=T-0.90\ T/10=0.10\ T$, which would be tolerable even in view of worst case variations.

Figure 5:
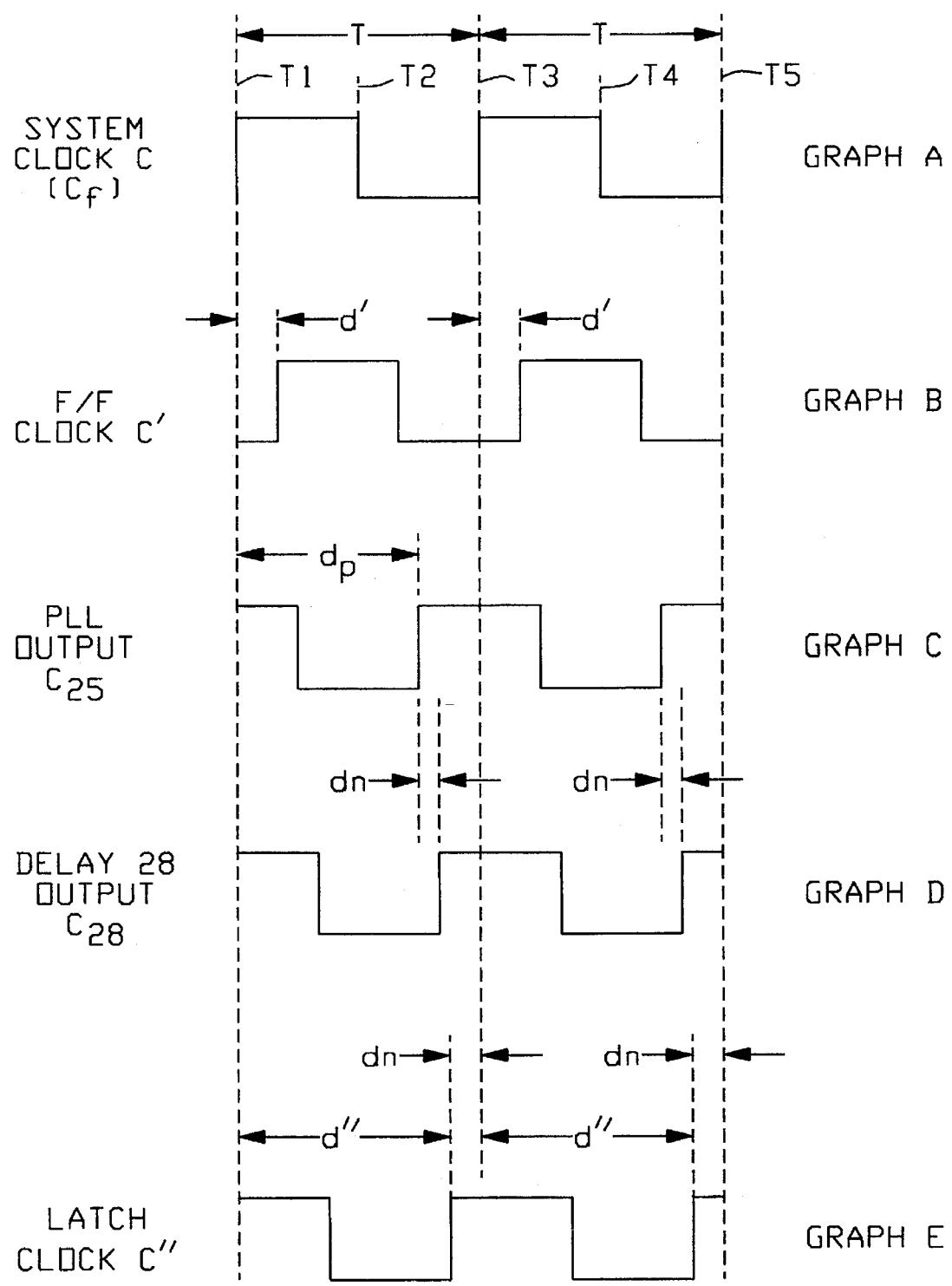
FIG. 5 is a series of graphs illustrating the operation of FIG. 4.

The operation of FIG. 4 is illustrated by the graphs of FIG. 5. Graph A in FIG. 5 illustrates the system clock C which is applied to input 25a of PLL 25. Graph A also illustrates feedback clock $C_f$ which is applied to PLL input 25b, since PLL 25 synchronizes $C_f$ with C. The requirement that the system clock C be applied to RAM 14 is thus met.

Graph B in FIG. 5 illustrates clock C' applied to flip-flop 16 which will be seen to be delayed by delay d' from the system clock C as a result of being applied thereto via delay 20 and clock buffer path 44. As mentioned previously, since the required delay d' is relatively small, its provision on-chip is tolerable.

Graph C in FIG. 5 illustrates clock signal $C_{25}$ appearing on PLL output 25c. Graph D in FIG. 5 illustrates the clock $C_{28}$ obtained after $C_{25}$ is delayed by delay 28. Note in Graphs C and D that, as is to be expected, $C_{28}$ is delayed from $C_{25}$ by $d_n$, the delay provided by delay 28. With respect to the delay $d_p$ shown between clock $C_{25}$ and the system clock C in Graphs A and B in FIG. 5, it will be understood that delay $d_p$ represents the delay required to be provided by PLL 25 in order to produce synchronism between C and $C_f$, as explained previously.

Graph E in FIG. 5 illustrates the resulting clock signal C" appearing at latch 16 in FIG. 4. It will be remembered that latch 16 requires the relatively long delay d" with respect to the system clock C (Graph C in FIG. 3). It will be understood from Graph E of FIG. 5 that this delay d" is obtained for clock C" as a result of the embodiment of FIG. 4 having provided the negative delay $d_n$ for C" with respect to the system clock C, which is equivalent to having provided the relatively long delay d" using delay 22 in FIG. 2.

Although the present invention has been described with respect to particular preferred embodiment, it is to be understood that various modifications in construction and arrangement are possible within the scope of the invention. Accordingly, the present invention is to be considered as including all modifications and variations coming within the scope of the invention as defined by the appended claims.

What is claimed is:

1. An integrated circuit chip comprising:

means for providing a system clock having a predetermined clock period;

a first component which requires said system clock;

a second component having an input which requires a clock having a relatively large delay with respect to said system clock, said relatively large delay being at least greater than one-half of said clock period;

a phase-locked-loop having two inputs and an output, one input being coupled to said system clock and the other input being coupled to said input of said first component, said phase-locked-loop being operative to synchronize the input signals applied thereto:

a delay element providing a delay substantially equal to the difference between said clock period and said large delay;

means for coupling the output of said phase-locked-loop to said input of said first component via a first path including said delay element; and means for coupling the output of said phase-locked-loop to said second component via a second path which does not include said delay element;

said first and second paths providing the same delay except for said delay element.

2. The integrated circuit chip of claim 1, including a third component which requires a clock having a relatively small delay with respect to said system clock, said relatively small delay being less than one-half of said clock period, said integrated circuit chip also including a second delay element substantially equal to said relatively small delay, said integrated circuit chip further including means for coupling the output of said phase-locked-loop to said third component via a third path which includes both said second delay element and said first-mentioned delay element, said third path providing the same delay as said first path except for said second delay element.

3. The integrated circuit chip of claim 2, wherein each of said first, second and third paths comprise clock buffer paths providing the same delay.

4. The integrated circuit chip of claim 3, wherein each clock buffer path includes a plurality of inverters.

5. The integrated circuit chip of claim 2, wherein one of said components comprises a flip-flop and another component comprises a RAM.

6. The integrated circuit chip of claim 2, wherein one of said components comprises a latch and another component comprises a RAM.

7. The integrated circuit chip of claim 3, wherein one of said components comprises a latch and another component comprises a flip-flop.

8. The integrated circuit chip of claim 2, wherein said chip is a VLSI chip.

9. The integrated circuit chip of claim 2, wherein said components are responsive to the rising edges of the respective clocks applied thereto.

10. The integrated circuit chip of claim 2, wherein said delay elements are provided by serially-connected inverters.

* * * * *